United States Patent [19]

Trillwood

[11] Patent Number: 4,968,206
[45] Date of Patent: Nov. 6, 1990

[54] SHUTTLE SYSTEM FOR RAPIDLY MANIPULATING A WORKPIECE INTO AND OUT OF AN ATMOSPHERICALLY CONTROLLED CHAMBER FOR DOING WORK THEREON IN THE CHAMBER

[75] Inventor: Richard E. Trillwood, Santa Ana, Calif.

[73] Assignee: Wentgate Dynaweld, Inc., Del.

[21] Appl. No.: 332,346

[22] Filed: Mar. 31, 1989

[51] Int. Cl.⁵ ............................................. B65G 65/30
[52] U.S. Cl. .................................. 414/217; 219/121.22
[58] Field of Search .............. 414/217, 225, 750, 751; 901/42; 198/379; 219/121.12, 121.13, 121.14, 121.21, 121.22, 121.35

[56] References Cited

U.S. PATENT DOCUMENTS

| | | | |
|---|---|---|---|
| 1,396,859 | 11/1921 | Long | 414/217 |
| 1,974,789 | 9/1934 | Angell | 414/217 |
| 3,633,770 | 1/1972 | Howard | 414/217 X |
| 3,756,435 | 9/1973 | Steigerwald | 414/217 |
| 4,150,759 | 4/1979 | Bell, Jr. | 414/217 X |
| 4,175,226 | 11/1979 | Kappelsberger et al. | 219/121.14 |
| 4,266,111 | 5/1981 | Trillwood | 219/121.22 |
| 4,482,796 | 11/1984 | Weissmann | 219/121.13 |
| 4,499,776 | 2/1985 | Robinson | 414/217 X |

FOREIGN PATENT DOCUMENTS

| | | | |
|---|---|---|---|
| 137588 | 6/1988 | Japan | 219/121.35 |
| 1604556 | 12/1981 | United Kingdom . | |

Primary Examiner—David A. Bucci
Attorney, Agent, or Firm—Price, Gess & Ubell

[57] ABSTRACT

An automated workpiece handling system rapidly moves a workpiece into a controlled atmosphere chamber, like a vacuum chamber, to a work station, like an electron beam, and withdraws the piece after the work has been completed. While at the work station, the handling system manipulates the piece linearly and in rotation, as desired, according to a set program. The workpiece is loaded and unloaded at the same location outside the chamber, at atmosphere. A split piston having a headstock and tailstock holds the workpiece. The piston seals the vacuum chamber during loading transfer in and out, and during the work cycle. During transfer into the vacuum chamber, pressure around the workpiece is reduced. A pneumatic counterbalance system reduces the loading on the piston drive system caused by the pressure differential between the vacuum chamber and atmosphere.

32 Claims, 5 Drawing Sheets

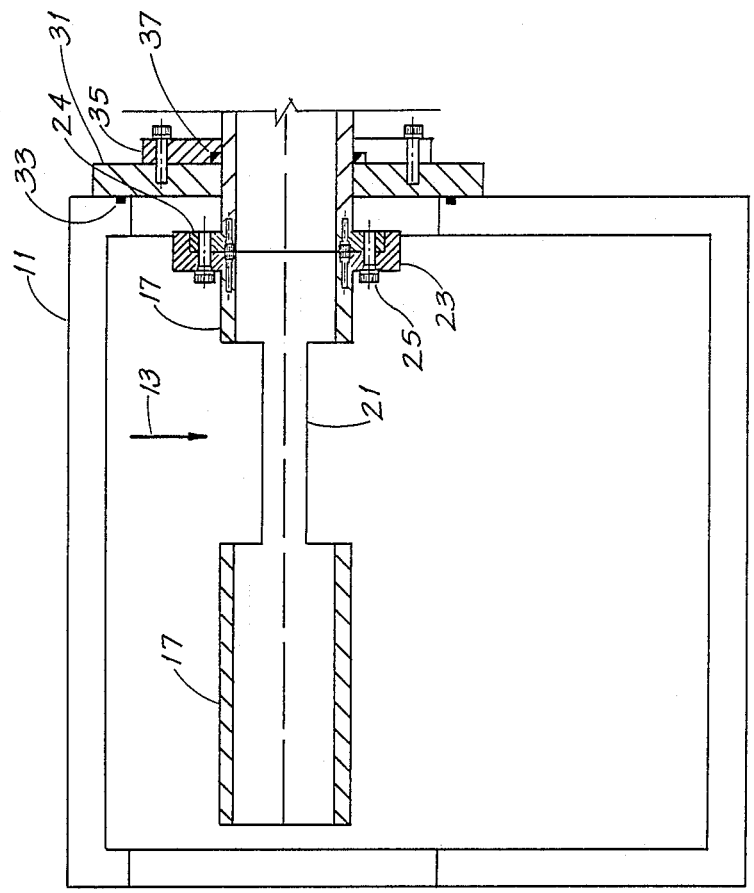

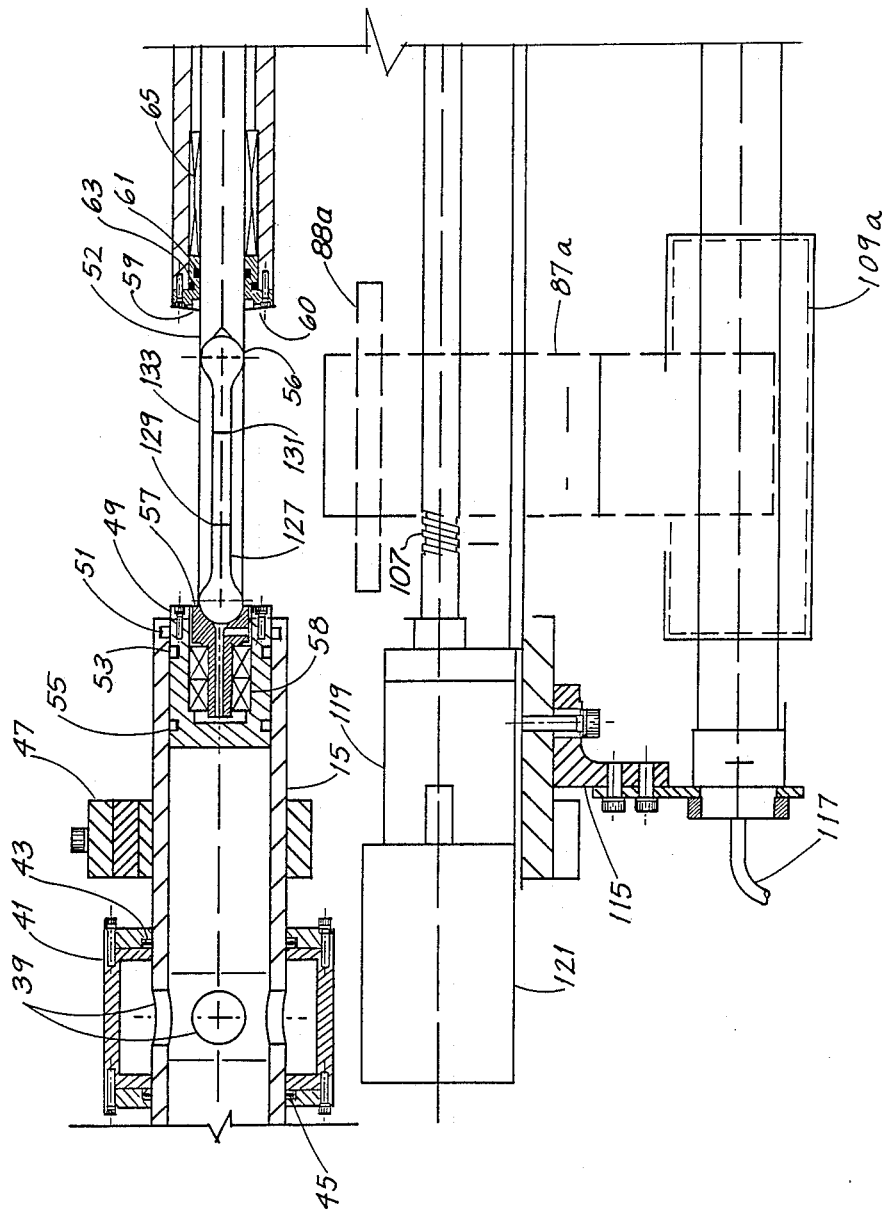

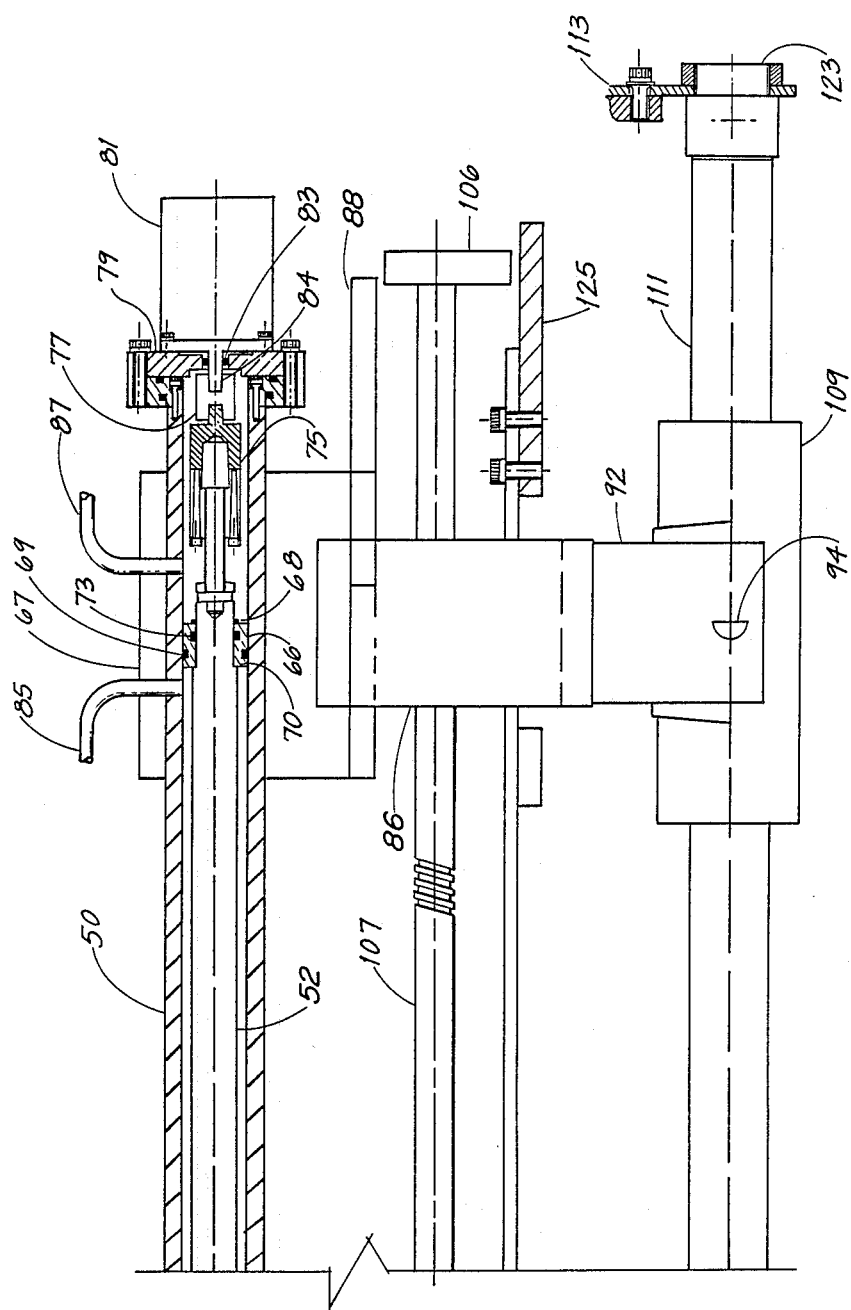

SHUTTLE SYSTEM FOR RAPIDLY MANIPULATING A WORKPIECE INTO AND OUT OF AN ATMOSPHERICALLY CONTROLLED CHAMBER FOR DOING WORK THEREON IN THE CHAMBER

BACKGROUND OF THE INVENTION

1. Field of the Invention

The present invention relates generally to improvements in workpiece transport systems and, more particularly, pertains to apparatus for transferring workpieces into a sealed chamber containing reduced pressure in which an operation is performed on such workpiece.

2. Description of the Prior Art

Transport systems for inserting workpieces into a vacuum chamber insert the workpieces either singly or in batches through a door in the vacuum chamber. After the chamber is sealed, it must be evacuated to a vacuum. Then, the pressure must be increased again for removal of the finished workpieces and insertion of replacements.

In order to avoid this cumbersome process, the inventor of the present invention devised a method of transporting a plurality of workpieces through a sealed chamber on a continuous basis in a plurality of individual workpiece compartments which move along an input passage, into the sealed chamber, and then out of the chamber along an output passage. Each individual compartment is sealed while in the input and output passage so that pressure in the individual compartments can be independently varied as necessary. The pressure in the individual compartments is reduced before it reaches the sealed chamber, thereby avoiding wide fluctuations of the reduced pressure in the sealed chamber. This method avoids the cumbersome process of raising and lowering the pressure in the vacuum chamber every time a workpiece is inserted and removed.

This system, however, does not readily lend itself to an automated loading process for the vacuum chamber or manipulation of the workpiece while in the chamber as does the present invention.

SUMMARY OF THE INVENTION

The present invention loads workpiece parts into a holder for transfer into a vacuum chamber without causing a pressure rise in the chamber during insertion or withdrawal of the workpiece. The invention comprises a tube with a split piston inside. The workpiece is held between the two parts of the piston, the headstock and tailstock. The workpiece can be rotated, moved linearly or held stationary at a predetermined position. Spaced seals are located on the headstock, creating a seal against the inside of the tube. The inside of the tube contains a seal at the end for sealing against the piston headstock when in the loading position and against the tailstock at other times. The seals in the headstock keep the vacuum chamber sealed during loading and insertion. The seal in the tube end keeps the vacuum chamber sealed at all other times. The force being exerted on the piston by the vacuum chamber is counterbalanced by a pneumatic system. The workpiece area between the headstock and tailstock of the piston is evacuated during insertion at a purge port in the tube prior to entry into the vacuum chamber.

BRIEF DESCRIPTION OF THE DRAWINGS

The objects and many of the attendant advantages of this invention will be readily appreciated as the same becomes better understood by reference to the following detailed description when considered in conjunction with the accompanying drawings, in which like reference numerals designate like parts throughout the figures thereof, and wherein:

FIGS. 1A, 1B and 1C shows a plan view partly in section of a preferred embodiment of the invention;

DETAILED DESCRIPTION OF THE PREFERRED EMBODIMENT

Figure 2:
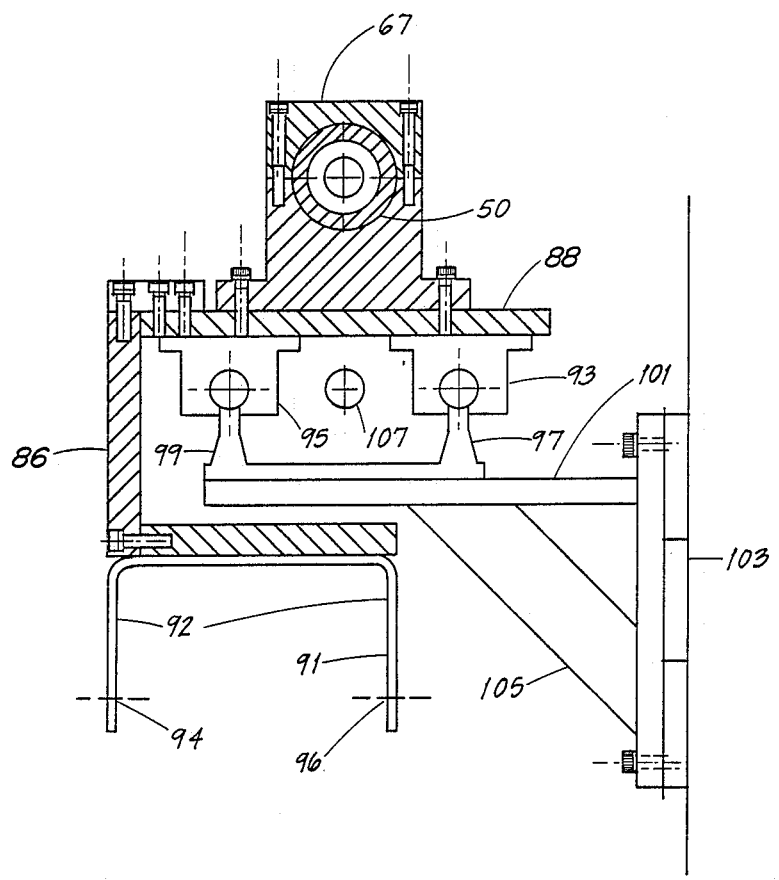
FIG. 2 is an end elevation partly in section of the apparatus of FIG. 1C.

FIGS. 1A, 1B and 1C in combination illustrate the complete assembly of the preferred embodiment of the present invention. FIG. 1A shows a vacuum chamber 11 of well-known construction having walls capable of withstanding reduced pressures in the chamber so that a vacuum of at least $10^{-4}$ to $10^5$ Torr could be produced in the chamber by suitable conventional pressure reducing means such as a diffusion pump (not illustrated). An electron gun (not shown) of suitable design is provided so that it can direct a beam 13 of electrons in a desired direction at a precise location within the sealed chamber 11.

A two-part tube 15, 17 pierces the wall of the chamber 11 to provide a passage into the chamber. Part 15 of the tube is located primarily exteriorly to the chamber 11. Part 17 of the tube is located within the chamber. Part 15 is connected to the chamber wall by a flange 24. Part 17 of the tube is connected to the inside of the chamber wall by a flange 23 which overlays flange 24. A series of set screws 25 or the like engage both flanges 23, 24 and fasten them rigidly to the wall of chamber 11.

Exterior to the vacuum chamber 11, a side plate 31 surrounds exterior tube portion 15, squeezing an O-ring 33 which is located in the exterior wall of chamber 11 around the access tube 15. Mounted to side plate 31 is an O-ring retainer plate 35 which is fastened to plate 31 by a threadable fastening means such as set screws, for example. The O-ring retainer plate seals around the periphery of exterior access tube 15 by an O-ring 37.

Halfway between the two ends of the exterior access tube 15 are a plurality of exhaust holes 39. A pumping port casing 41 surrounds exhaust holes 39. The pumping port casing 41 is sealed to the exterior of access tube 15 by a pair of O-rings 43, 45 located in pumping port casing 41.

Besides being rigidly mounted to the wall of vacuum chamber 11, exterior access tube 15 is supported by a tube support 47, which keeps exterior access tube 15 within its desired alignment.

The open end of tube 15 has a headstock 49 of a split piston located therein. The split piston is comprised of a headstock 49 and a tailstock 50. The 49 and tailstock 50 are physically connected together by means of rigid straps 133, 135. The headstock 49 contains a primary O-ring quad seal 55 therein which seals the headstock 49 against the interior of access tube 15. A secondary O-ring quad seal 53 is located downstream on headstock 49. Located within the walls of access tube 15 is another quad O-ring 51 which seals the interior of the access tube 15 against the headstock of the split piston or the tailstock 50, as the case may be.

Contained within headstock 49 is a workpiece or locating gripping device 57 which is fixedly but rotatably mounted therein by means of bearings 58. The face of workpiece gripping means 57 is adapted to fit the curvature of the end of workpiece 127.

Workpiece 127 is shown, for illustration purposes only, to comprise a three-piece bone-shaped linkage which needs to be circumscribe welded at locations 129 and 131. The other end of workpiece 127 is grasped by tailstock rod 52 located inside tailstock 50 which has an end formed to grasp the shape of that end of workpiece 127.

Tailstock rod 52 is mounted for transitional and rotational movement within tailstock 50. Tailstock rod 52 is sealed by O-ring seals to tailstock 50. O-ring seal 63 seals end mounting plate 60 to tailstock tube 50. A quad ring seal 61 seals end mounting plate 60 to tailstock rod 52.

Tailstock rod 52 is mounted for rotary and translational motion within tailstock tube 50 by bearing assembly 65, which allows tailstock rod 52 to rotate and move linearly around its axis.

The other end of tailstock rod 52, opposite the workpiece contact end, is connected to a helicoil coupler 77 through a spline bushing-spacer mechanism 75, which is fixedly attached to the end of tailstock rod 52. A piston plunger 66 is mounted on the smaller diameter portion of tailstock rod 52 against the ridge 70. It is held against the ridge by a snap ring 68. Piston plunger 66 has a pair of O-rings located therein. A quad O-ring 69 seals the piston plunger 66 to the interior of tailstock 50. An O-ring 73 located downstream of the quad O-ring 69 seals the circumference of tailstock rod 52 to piston plunger 66. The piston plunger and O-rings create two separate pressure chambers within tailstock 50 of the piston.

A pressure line 85 goes into one pressure chamber located on the front side of piston plunger 66. Another pressure line 87 goes into the other thus-created chamber on the back side of piston plunger 66.

A motor 81, which could be a computer controlled stepper motor, is mounted to a motor flange 79. The shaft 84 of the motor passes through the flange and is sealed thereto by an O-ring 83. The motor shaft 84 is connected to the flexible helical coupler 77. This entire assembly seals the open end of tailstock tube 50.

Motor 81 through flexible helical coupler 77 and the coupling mechanism 75 causes rotation of tailstock rod 52 within bearing 65 and piston plunger 66, thereby rotating workpiece 127. The other end of workpiece 127 follows this rotation because it is contacting rotatably mounted workpiece gripping device 57.

Tailstock rod 52 is actuated for lateral movement to either engage or disengage workpiece 127 by pneumatic means (not shown) simply by applying pressure into line 87 (engage) or line 85 (disengage). Applying pressure to line 85 causes plunger 66 to move against snap ring 68. This movement of the tailstock rod 52 to the right is made possible by the sliding spline in the flexible helical coupler 77. Moving tailstock rod 52 to the right causes the space between the two gripping faces of headstock 57 and tailstock 52 to increase beyond the length of workpiece 127, allowing the workpiece to be removed or inserted.

Assuming a workpiece is inserted, increased pressure into line 87 causes a pressure increase on the other side of piston plunger 66 to move it against ridge 70 of tailstock rod 52. This force moves the tailstock rod 58 to the left to engage workpiece 127 and forcibly hold it against headstock engaging face 57.

Referring now to FIG. 2, it can be seen that the piston comprised of the headstock 49 (FIG. 1B) and tailstock 50 is held by a piston cradle 67 at the tail end of tailstock 50. Piston cradle 67 is mounted on a platform 88. Platform 88 has a pair of rail rider blocks 93, 95 mounted to the underside which, respectively, engage rails 97 and 99. The rail structure 97, 99 is mounted to a platform 101 that is attached to a wall or other vertical support structure 103 by a suitable bracing and fastening mechanism 105. Attached to platform 88 is a downwardly-extending plate 86, which has a U-shaped bracket 91 with arms 92 attached thereto.

The rails 97, 99 and rail rider blocks 93, 95 provide for movement of the piston headstock 49 and tailstock 50 laterally along its axis. Referring now again to FIGS. 1A, 1B and 1C, such movement causes the headstock to move through the access tube 15, past exhaust holes 39 into vacuum chamber 11, and into the interior segment of the access tube 17. This lateral movement, as will be more fully described hereinafter, positions workpiece 127 precisely as required with respect to the electron beam 13 to effectuate the welds 129, 131 required on the workpiece.

Referring both to FIG. 2 and to FIGS. 1A, 1B and 1C, platform 88 has journalled therein a drivescrew 107. The opposite end of drive screw 107 is held in bearing 119 and fastened to a motor 121, which is preferably a brushless DC motor driven by a programmable servo-mechanism that is under computer control (not shown).

Rotation of the drive screw 107 by motor 121 causes the platform 88, along with piston cradle 67 and the piston 49, 50, to move laterally along its axis to the left or to the right, depending upon the direction of rotation. The speed of lateral movement is controlled by the speed of rotation of the drive screw. FIGS. 1B and 1C show two extremes of travel for platform 88. At the right end, the platform 88 (in solid lines) is located so as to permit loading of workpiece 127 into the split piston 49, 50. At the left end the platform 88a (in dashed lines) is located where it would be when the workpiece 127 is inside the vacuum chamber 11, underneath electron beam 13.

A pair of support brackets 115, 113 support a thin wall stainless steel tube 111. One end of tube 111 is sealed and has a pneumatic hose 117 connected thereto. The other end 123 of tube 111 is open to the atmosphere. Mounted to support arms 92 of the U-bracket 91 and surrounding a short section of tube 111 is a sleeve 109. Tubular sleeve 109 is pivotally mounted to arms 92 of the U-bracket at pivot points 94, 96 respectively.

As platform 88 moves laterally along the axis of tailstock rod 52, sleeve 109 moves laterally along the axis of tube 111. Because of the pivot mounting no side loading occurs.

Figure 4:
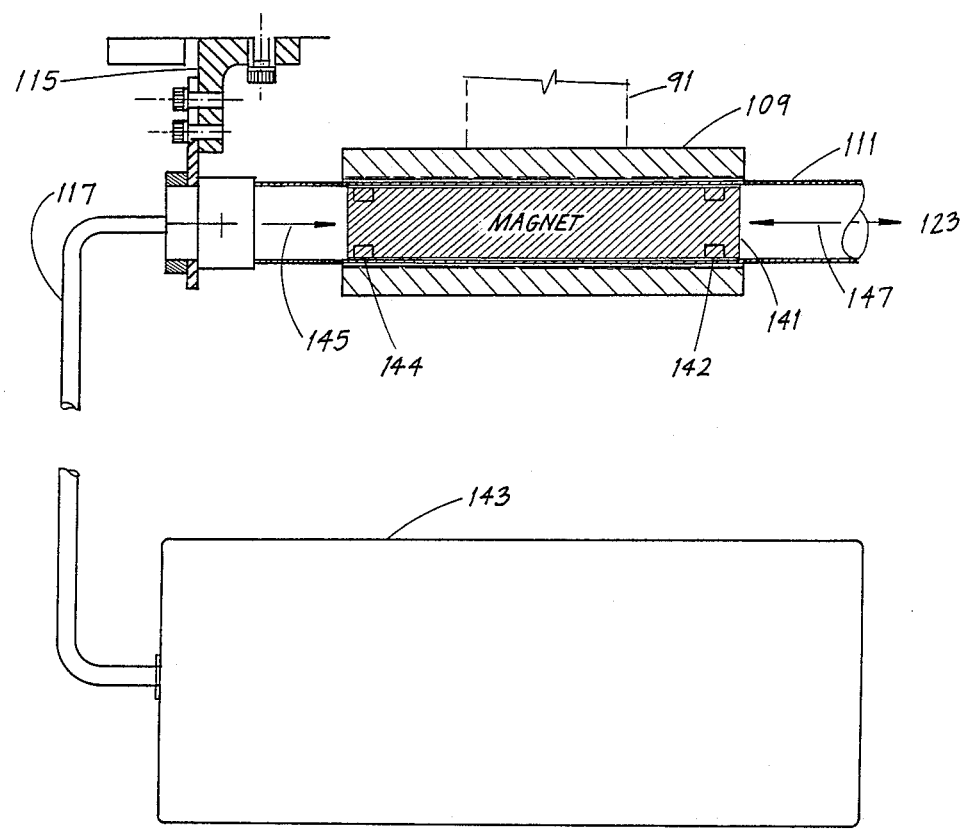
FIG. 4 is a plan view partly in section of a portion of the apparatus shown in FIG. 1B connected to additional apparatus not shown in FIG. 1C.

Referring more specifically to FIG. 4, it can be seen that a free-moving piston 141, preferably a strong rare earth magnet, is located inside the tube and sealed with O-rings 142, 144 at either end. The closed end of tube 111 is connected by pneumatic line 117 to a tank 143 having a much greater volume than tube 111, at least ten times as great. Tank 143 is effectively a constant source of pneumatic pressure 145 in a direction from left to right, as indicated. This constant pressure will cause magnet piston 141 to move to the right, causing sleeve 109 riding on the outside of tube 111 to follow. The nature of the materials used provides a strong magnetic coupling between the magnet piston and the follower sleeve 109.

Because sleeve 109 is pivotally attached to U-bracket arms 92 of platform 88, a constant linear pressure along the axis of movement will be applied to platform 88, tending to move the platform to the right in counterbalance to and away from vacuum chamber 11.

Figure 3:
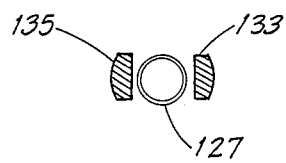
FIG. 3 is a partial cross-section of the workpiece loading area of FIG. 1B.

The function of the above-described transfer and manipulation mechanism will now be described. At the position shown in FIGS. 1A, 1B and 1C, the transfer system is at the load/unload position. A blast of pneumatic pressure into line 85 causes tailstock rod 52 to move to the right, releasing completed workpiece 127 and allowing insertion of a workpiece that needs to be welded at weld joint locations 129, 131. The workpiece to be welded is placed into position between support straps 135, 133 (FIG. 3), which connect headstock 49 with tailstock 50. A blast of pneumatic pressure into line 87 moves tailstock rod 52 to the left, causing it to engage and grasp the new workpiece 127 between grasping face 57 of headstock 49 and grasping face 56 of tailstock rod 52.

The workpiece 127 now being held firmly in place between headstock 49 and tailstock rod 52 of tailstock 50, motor 121 is actuated to turn drive screw 107, thereby rapidly pulling platform 85 towards it. As it does so, headstock 49 moves into external passage tube 15 towards vacuum chamber 11. The movement is constant and rapid. Headstock 49 travels past the exhaust holes 39 within pumping port casing 41. This area is constantly being evacuated by a mechanical pump to a pressure of from $10^{-1}$ to $10^{-2}$ Torr.

The spacing of seals 55 and 53 is greater than the diameter of the exhaust holes 39. When quad seal 55, is located on the vacuum chamber side of exhaust holes 39, quad seal 51 located in passage tube 15 is engaging tailstock 50, thereby creating a sealed chamber around workpiece 127. The pressure in this chamber is at atmosphere. As quad seal 53 moves over exhaust holes 39, the atmospheric pressure around workpiece 127 is evacuated to approximately $10^{-2}$ Torr as it moves past pumping port casing 41. Seal 55 continues to isolate the vacuum chamber and prevents the sudden pressure rise caused by the workpiece moving past the exhaust holes 39 from affecting the vacuum chamber pressure.

As workpiece 127 continues down the passage tube 15 and into vacuum chamber 11, tailstock 50 now maintains the seal against atmospheric pressure by engagement with quad seal 51 and, of course, the various seals located in end plate 60. The vacuum chamber 11 is preferably maintained at $10^{-4}$ to $10^{-5}$ Torr by a diffusion pump. The differential of $10^{-1}$ Torr between the pressure around the workpiece entering the chamber and the pressure of the chamber is insufficient to increase the pressure of vacuum chamber 11 above a workable level. This is due to the relatively large volume difference between the vacuum chamber and the workpiece area.

As the workpiece enters the work station area underneath electron beam 13, headstock 49 moves into section 17 of the access pipe. This section of the pipe simply holds headstock 49 steady and protects the seals of headstock 49 from damage. While underneath electron beam 13, workpiece 127 is rotated to create a continuous circumferential weld at weld joint 129 by motor 81 rotating tailstock rod 52. After weld 129 is complete, motor 121 is activated to move the workpiece further into vacuum chamber 11 until weld location 131 is underneath electron beam 13. Again, motor 81 is engaged to rotate workpiece 127 until the weld is complete.

At that point, servodriven motor 121 is engaged to rapidly turn drive screw 107 in the opposite direction to move platform 88 to the right, thereby pulling split piston 49, 50 out of the vacuum chamber 11 to the unload location. The workpiece moves past the pumping port casing 41 until it returns to atmosphere. Thereafter, the headstock and tailstock are located again at the unload/load location shown in FIG. 1B, giving rise to unloading of a completed workpiece and loading of an incomplete workpiece.

Because of the pressure differential between the interior of vacuum chamber 11 and atmosphere, there is a 1-bar force being exerted on headstock 49 and tailstock 50, attempting to pull it into vacuum chamber 11. In order to provide precise lateral movement of the workpiece, the present invention contemplates counterbalancing of this force by the cylinder counterbalance assembly which consists of the tube 111, its magnetic floating piston 141, and the external floating sleeve 109. Due to the pressure reservoir 143 applying a constant pressure 145 in an amount equal to and a direction opposite to the force exerted by vacuum chamber 11, the force exerted by vacuum chamber 11 is neutralized. This allows the servodrive motor 119 to very accurately and precisely laterally place workpiece 127 underneath electron beam 13.

As can be seen, the above invention provides for rapid insertion and extraction of a workpiece into a high vacuum chamber. Precise manipulation of the workpiece while in that chamber, both laterally and in rotation, effectuate a variety of welds on that workpiece. Because the workpiece is loaded and unloaded at the same location, the transport system easily accommodates robotic loading and unloading mechanisms.

Obviously, many modifications and variations of the present invention are possible. In light of the above teachings, it is therefore to be understood that within the scope of the appended claims, the invention may be practiced otherwise than as specifically described.

What is claimed is:

1. Shuttle system for moving a workpiece into and out of a sealed chamber containing a controlled reduced pressure atmosphere for doing work on the workpiece in the chamber, said system comprising:

a passageway extending into said sealed chamber at a first end and being open to the atmosphere at a second end and having at least one exhaust hole between said first end and said second end for reducing pressure in said passageway;

a split piston having a headstock with a leading end and a trailing end and a tailstock with a leading and a trailing end with space between said headstock and tailstock for holding a workpiece, said piston being sized to fit and move within said passageway;

a rod contained within said split piston tailstock extending along its length, said rod engaging one end of said workpiece;

first sealing means located on the headstock of said piston for sealing said headstock against an interior of said passageway at said first sealing means;

second sealing means located at the second end of said passageway for sealing the interior of said passageway to said piston at said second sealing means, a spacing between said first and second sealing means being such that when said first sealing means is on a chamber side of said exhaust hole, said second sealing means is engaging the leading end of said tailstock; and means for moving said piston into and out of said chamber through said passageway.

2. The shuttle system of claim 1 wherein said rod is mounted for rotation within said tailstock.

3. The shuttle system of claim 2 further comprising sealing means located at the leading end of said tailstock for sealing the interior of said tailstock to said rod at said leading end.

4. The shuttle system of claim 3 further comprising sealing means located at the trailing end of said tailstock for sealing the interior of said tailstock to said rod at said trailing end.

5. The shuttle system of claim 4 further comprising coupling means connected to the trailing end of said rod for imparting rotary motion to said rod.

6. The shuttle system of claim 5 further comprising a motor means mounted to the trailing end of said tailstock and connected to said coupling means.

7. The shuttle system of claim 6 wherein said coupling means permits translational motion along the axis of rotation of said rod.

8. The shuttle system of claim 7 further comprising pneumatic means connected to said tailstock for moving said rod either back or forth along its axis of rotation, thereby causing the rod to disengage or engage the workpiece.

9. The shuttle system of claim 8 wherein said split piston moving means comprises:
 a motor; and
 a drivescrew mounted to the output shaft of said motor and threadably attached to the tailstock of said split piston.

10. The shuttle system of claim 9 further comprising:
 a mounting platform having a piston cradle attached thereto, the tailstock of said split piston being held fast by said piston cradle; and
 a pair of rails extending parallel to the central axis of said passageway, said mounting platform riding on said rails, said drivescrew threadably engaging said mounting platform.

11. The shuttle system of claim 10 wherein said motor comprises a programmable motor.

12. The shuttle system of claim 9 further comprising pneumatic means for balancing the forces being exerted on said split piston by said chamber when the piston is moved into and out of said chamber by said split piston moving means.

13. The shuttle system of claim 6 wherein said split piston moving means comprises:
 a motor; and
 a drivescrew mounted to the output shaft of said motor and threadably attached to the tailstock of said split piston.

14. The shuttle system of claim 13 further comprising:
 a mounting platform having a piston cradle attached thereto, the tailstock of said split piston being held fast by said piston cradle; and
 a pair of rails extending parallel to the central axis of said passageway, said mounting platform riding on said rails, said drivescrew threadably engaging said mounting platform.

15. Shuttle system for moving a workpiece into and out of a sealed chamber containing a controlled reduced pressure atmosphere for doing work on the workpiece in the chamber, said system comprising:
 a tubular passageway extending into said sealed chamber at a first end and being open to the atmosphere at a second end and having at least one exhaust hole between said first end and said second end for reducing pressure in said passageway;
 a split piston having a headstock with a leading end and a trailing end and a tailstock with a leading and trailing end with space between said headstock and tailstock for holding a workpiece, said piston being sized to fit and move within said passageway;
 first sealing means located on the headstock of said piston for sealing said headstock against an interior of said passageway at said first sealing means;
 second sealing means located at the second end of said passageway for sealing the interior of said passageway to said piston at said second sealing means, spacing between said first and second sealing means being such that when said first sealing means is on a chamber side of said exhaust hole, said second sealing means is engaging the leading end of said tailstock;
 a motor having an output shaft; and
 a drivescrew means mounted to the output shaft of said motor and threadably attached to the tailstock of said split piston for moving said piston into and out of said chamber.

16. The shuttle system of claim 15 further comprising:
 a mounting platform having a piston cradle attached thereto, the tailstock of said split piston being held fast by said piston cradle; and
 a pair of rails extending parallel to the central axis of said passageway, said mounting platform riding on said rails, said drivescrew threadably engaging said mounting platform.

17. Shuttle system for moving a workpiece into and out of a sealed chamber for doing work on the workpiece in the chamber, said system comprising:
 a tubular passageway extending into said sealed chamber at a first end and being open to the atmosphere at a second end and having at least one exhaust hole between said first and second end for reducing the pressure in said passageway;
 a split piston having a headstock with a leading and trailing end and a tailstock with a leading and trailing end, with space between the headstock and tailstock for accommodating a workpiece smaller in diameter than the piston, said piston being sized to fit and move within said passageway;
 a rod located in said split piston tailstock extending along its length, said rod engaging one end of said workpiece;
 first sealing means located on the headstock for sealing the headstock against an interior of said passageway at said first sealing means;
 second sealing means located at the second end of said passageway for sealing the interior of said passageway to said piston at said second sealing means, the spacing between said first and second sealing means being such that when said first sealing means is on a chamber side of said exhaust hole, said second sealing means is engaging the leading end of said tailstock, whereby said first sealing means seals said chamber from the atmosphere at all times and during insertion of the workpiece, seals the chamber from the exhaust hole after said second sealing means engages the tailstock of said piston;

means for moving said piston into and out of said chamber through said passageway; and means for rotating the workpiece while it is located between the headstock and tailstock of said split piston.

18. The shuttle system of claim 17 wherein said rod is mounted for rotation within said tailstock.

19. The shuttle system of claim 18 further comprising sealing means located at the leading end of said tailstock for sealing the interior of said tailstock to said rod at said leading end.

20. The shuttle system of claim 19 further comprising sealing means located at the trailing end of said tailstock for sealing the interior of said tailstock to said rod at said trailing end.

21. The shuttle system of claim 20 further comprising coupling means connected to the trailing end of said rod for imparting rotary motion to said rod.

22. The shuttle system of claim 21 further comprising a motor means mounted to the trailing end of said tailstock and connected to said coupling means.

23. The shuttle system of claim 22 wherein said coupling means permits translational motion along the axis of rotation of said rod.

24. The shuttle system of claim 23 further comprising pneumatic means connected to said tailstock for moving said rod either back or forth along its axis of rotation, thereby causing the rod to disengage or engage the workpiece.

25. The shuttle system of claim 24 wherein said split piston moving means comprises:

a motor; and a drivescrew mounted to the output shaft of said motor and threadably attached to the tailstock of said split piston.

26. The shuttle system of claim 25 further comprising:

a mounting platform having a piston cradle attached thereto, the tailstock of said split piston being held fast by said piston cradle; and a pair of rails extending parallel to the central axis of said passageway, said mounting platform riding on said rails, said drivescrew threadably engaging said mounting platform.

27. The shuttle system of claim 26 wherein said motor comprises a programmable motor.

28. The shuttle system of claim 27 further comprising pneumatic means for balancing the forces being exerted on said split piston by said chamber when the piston is moved into and out of said chamber by said split piston moving means.

29. The shuttle system of claim 17 further comprising pneumatic means for balancing forces being exerted on said split piston by said chamber as the piston is moved into or out of said chamber by said piston moving means.

30. The shuttle system of claim 29 wherein said pneumatic balancing means comprises:

a pressurized cylinder having one end open to the atmosphere and the other end connected to a constant source of pressure;

a piston located in said cylinder mounted for movement therein from one end to the other and reacting to a force being applied by pneumatic pressure at a pressure end of said cylinder; and a shoe mounted for movement on the outside of said cylinder and magnetically coupled to said piston in said cylinder whereby said shoe and said piston move together and forces applied to the cylinder are transferred to the shoe.

31. Shuttle system for moving a workpiece into and out of a sealed chamber containing a controlled reduced pressure atmosphere for doing work on the workpiece in the chamber, said system comprising:

a passageway extending into said sealed chamber at a first end and being open to the atmosphere at a second end and having at least one exhaust hole between said first and second end for reducing pressure in said passageway;

a split piston having a headstock with a leading and a trailing end and a tailstock with a leading and trailing end, with space between said headstock and tailstock for holding a workpiece, said piston being sized to fit and move within said passageway;

first sealing means located on the headstock of said piston for sealing said headstock against an interior of said passageway at said first sealing means;

second sealing means located at the second end of said passageway for sealing the interior of said passageway to said piston at said second sealing means, the spacing between said first and second sealing means being such that when said first sealing means is on a chamber side of said exhaust hole, said second sealing means is engaging the leading end of said tailstock;

means for moving said piston into and out of said chamber through said passageway; and pneumatic means for balancing the forces being exerted on said split piston by said chamber as the piston is moved into or out of said chamber by said piston moving means.

32. The shuttle system of claim 31 wherein said balancing means comprises:

a pressurized cylinder having one end open to the atmosphere and the other end connected to a constant source of pressure;

a piston located in said cylinder mounted for movement therein from one end to the other and reacting to a force being applied by pneumatic pressure at a pressure end of said cylinder; and a shoe mounted for movement on the outside of said cylinder and magnetically coupled to said piston in said cylinder whereby said shoe and said piston move together and forces applied to the cylinder are transferred to the shoe.

* * * * *